(12) United States Patent
Lau et al.

(10) Patent No.: US 11,109,506 B2
(45) Date of Patent: Aug. 31, 2021

(54) FIBER MANAGEMENT SLIDING TRAY SYSTEM

(71) Applicant: Ciena Corporation, Hanover, MD (US)

(72) Inventors: Alexander Lau, San Ramon, CA (US);
David Pearson, Sunnyvale, CA (US);
Roger Membreno, Hayward, CA (US);
David Stubbings, Amsterdam (NL)

(73) Assignee: Ciena Corporation, Hanover, MD (US)

( * ) Notice: Subject to any disclaimer, the term of this patent is extended or adjusted under 35 U.S.C. 154(b) by 74 days.

(21) Appl. No.: 16/683,372

(22) Filed: Nov. 14, 2019

(65) Prior Publication Data
US 2021/0153374 A1    May 20, 2021

(51) Int. Cl.
*H05K 7/14* (2006.01)
*G02B 6/44* (2006.01)

(52) U.S. Cl.
CPC ......... *H05K 7/1491* (2013.01); *G02B 6/4453* (2013.01); *H05K 7/1489* (2013.01)

(58) Field of Classification Search
CPC .... H05K 7/1491; H05K 7/1489; H05K 7/183; G02B 6/4453
See application file for complete search history.

(56) References Cited

U.S. PATENT DOCUMENTS

| | | | |
|---|---|---|---|
| 6,021,047 A * | 2/2000 | Lopez | H02B 1/36 312/223.2 |
| 6,259,604 B1 * | 7/2001 | Kuster | H02B 1/305 361/724 |
| 6,392,149 B1 * | 5/2002 | Kim | H05K 7/1491 174/70 R |
| 6,675,720 B2 * | 1/2004 | Peterson | H02G 11/00 104/196 |
| 6,748,154 B2 | 6/2004 | O'Leary et al. | |
| 6,748,155 B2 | 6/2004 | Kim et al. | |
| 6,856,505 B1 * | 2/2005 | Venegas | G06F 1/1601 361/679.05 |
| 6,972,949 B1 * | 12/2005 | Helgenberg | G06F 1/183 361/679.02 |
| 7,079,744 B2 | 7/2006 | Douglas et al. | |
| 7,256,986 B2 * | 8/2007 | Williams | G06F 1/16 211/149 |
| 7,570,861 B2 | 8/2009 | Smrha et al. | |
| 9,405,086 B2 * | 8/2016 | Erdman | G02B 6/4249 |
| 9,781,859 B1 * | 10/2017 | Wishman | F16L 3/26 |
| 9,811,125 B2 * | 11/2017 | Jau | G06F 1/187 |
| 9,817,201 B2 | 11/2017 | Lee et al. | |

(Continued)

*Primary Examiner* — Ko H Chan
(74) *Attorney, Agent, or Firm* — Clements Bernard Walker; Lawrence A. Baratta, Jr.; Christopher L. Bernard (57) ABSTRACT

A sliding tray assembly for rack mounted equipment is disclosed. The sliding tray includes a sliding bracket assembly, an arm support bracket, a tray, and an arm. The sliding bracket assembly is configured to mount to a rack. The arm support bracket is configured mount at a back of the rack The tray is configured to slidably mount to the sliding bracket assembly and includes one or more surfaces configured to support a chassis. The arm is configured to direct fiber from a back of the rack to the tray. The arm includes multiple links pivotally joined together. The multiple links including a first link configured to be pivotally joined to the arm support bracket and a second link configured to be pivotally joined to the tray.

17 Claims, 6 Drawing Sheets

(56) References Cited

U.S. PATENT DOCUMENTS

| | | |
|---|---|---|
| 9,949,400 B2 * | 4/2018 | Yi ........................ H02G 11/006 |
| 10,133,302 B2 * | 11/2018 | Yuan ........................ G06F 1/182 |
| 2003/0165315 A1 | 9/2003 | Trebesch et al. |
| 2006/0275008 A1 | 12/2006 | Xin |
| 2008/0085092 A1 | 4/2008 | Barnes |
| 2009/0226142 A1 | 9/2009 | Barnes et al. |
| 2014/0086545 A1 | 3/2014 | Solheid et al. |
| 2016/0037667 A1 * | 2/2016 | Wu ........................ H05K 7/1491 |
| | | 312/223.6 |

* cited by examiner

FIBER MANAGEMENT SLIDING TRAY SYSTEM

FIELD OF THE DISCLOSURE

The present disclosure generally relates to rack mounted networking equipment. More particularly, the present disclosure relates to a fiber management sliding tray for service rack mounted networking equipment.

BACKGROUND OF THE DISCLOSURE

As the need for network, compute, and storage resources expands, so too does the deployment of rack mounted equipment. Rack mounted equipment can include, without limitation, networking hardware, server hardware, storage hardware, etc. Such equipment is typically deployed in racks in data centers, central offices, etc., in cabinets in customer locations, and the like. To conserve space, the deployments can be restricted where access to the equipment is limited. For example, when there is limited or no access to a back of the rack, access to inspect or repair the rear of the equipment can be difficult. This difficulty can be due, in part, to the fiber connected to the networking equipment. Current solutions provide fixed sliding trays, but without any fiber management and the fiber may not have enough slack within the cabinet. Current fiber managers offer little to no rear access to the networking equipment and are often limited to indoor applications. Thus, when rear access to the networking equipment is required, the networking equipment may need to be disconnected during inspection and repair, disrupting operation.

BRIEF SUMMARY OF THE DISCLOSURE

The present disclosure relates to systems and methods for an integrated solution to fiber management for rack mounted equipment (chassis), such as networking hardware, server hardware, storage hardware, etc., to provide access to a rear of the equipment when there is limited or no access. Such access is provided via a sliding tray assembly with integrated fiber management that enables the equipment to slide out, in-service. The sliding tray assembly includes an arm with multiple links that are pivotally connected such that the arm can fold when a tray of the sliding tray assembly is in a retracted position and can extend when the tray is in an extended position. The chassis can be mounted on the tray such that the tray and the chassis can slide in and out of the cabinet. The folding/extending arm can accommodate enough fiber/cable slack and ensure that enough fiber/cable slack is present to support having the tray fully extended with the chassis remaining in-service. As such, the chassis and tray can slide out allowing an operator to access the rear of the chassis, which allows the operator to access fiber/cable, replace fans, and inspect the rear of the chassis while the chassis remains in-service.

In an embodiment, a sliding tray assembly for rack mounted equipment includes a sliding bracket assembly configured to mount to a rack; an arm support bracket configured mount at a back of the rack; a tray configured to slidably mount to the sliding bracket assembly, the tray including one or more surfaces configured to support a chassis; and an arm configured to direct fiber from a back of the rack to the tray, the arm including multiple links pivotally joined together, the multiple links including a first link configured to be pivotally joined to the arm support bracket and a second link configured to be pivotally joined to the tray. In a retracted position, a back end of the tray is adjacent a back of the rack and the multiple links of the arm are in a folded position, and, in an extended position, the back end of the tray is further from the back of the rack than in the retracted position and the angles between adjacent links are larger in the extended position than in the retracted position. The arm is on a plane different than the one or more surfaces configured to support the chassis such that the multiple links are folded below the chassis when the tray is in the retracted position. The sliding tray assembly can further include a guide that is on a plane different than the one or more surfaces configured to support the chassis, the guide being configured to direct fiber from a front of the rack to the back of the rack. The guide can include an entry trough positioned at the front of the rack and a guide bracket extending along the second bracket from the entry trough to the arm support bracket. The arm can include at least one of (1) one or more clips on at least one of the multiple links, the one or more clips configured to hold the fiber, and (2) one or more strap mounts on at least one of the multiple links, the one or more strap mounts configured to receive straps for securing the fiber to the arm. The tray can include a guide channel configured to direct the fiber to a front end of the tray from a position located between the front end and the back end. A front end of the tray can be configured to protrude beyond the chassis, the tray including a front-end cover configured to cover the front end, the front-end cover including slots configured for fiber to extend therethrough.

In another embodiment, a method for managing fiber of rack mounted equipment includes providing a sliding bracket assembly; providing an arm support bracket configured to mount at a back of the rack; providing a tray configured to slidably mount to the sliding bracket assembly, the tray including one or more surfaces configured to support a chassis; and providing an arm configured to direct fiber from a back of the rack to the tray, the arm including multiple links pivotally joined together, the multiple links including a first link configured to be pivotally joined to the arm support bracket and a second link configured to be pivotally joined to the tray.

In a further embodiment, a system includes a rack including mounting brackets; and a sliding bracket assembly including a sliding bracket assembly mounted to the mounting brackets; an arm support bracket mounted at a back of the rack; a tray slidably mounted to the sliding bracket assembly, the tray including one or more surfaces configured to support a chassis; and an arm configured to direct fiber from a back of the rack to the tray, the arm including multiple links pivotally joined, the multiple links including a first link pivotally joined to the arm support bracket and a second link pivotally joined to the tray.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

Again, in various embodiments, the present disclosure relates to systems and methods for an integrated solution to fiber management for rack mounted equipment (chassis), such as networking hardware, server hardware, storage hardware, etc., to provide access to a rear of the equipment when there is limited or no access. Such access is provided via a sliding tray assembly with integrated fiber management that enables the equipment to slide out, in-service. The sliding tray assembly includes an arm with multiple links that are pivotally connected such that the arm can fold when a tray of the sliding tray assembly is in a retracted position and can extend when the tray is in an extended position. The chassis can be mounted on the tray such that the tray and the chassis can slide in and out of the cabinet. The folding/extending arm can accommodate enough fiber/cable slack and ensure that enough fiber/cable slack is present to support having the tray fully extended with the chassis remaining in-service. As such, the chassis and tray can slide out allowing an operator to access the rear of the chassis, which allows the operator to access fiber/cable, replace fans, and inspect the rear of the chassis while the chassis remains in-service.

Figure 1:
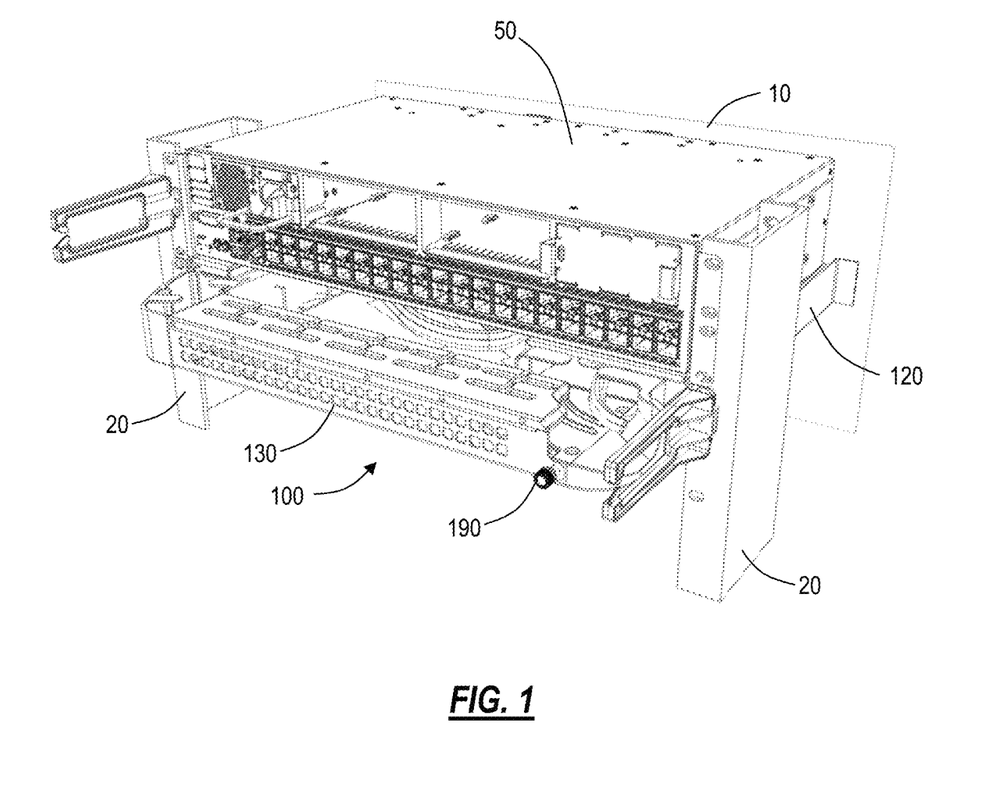
FIG. 1 is a perspective diagram of a sliding tray assembly with a chassis installed with a tray of the sliding tray assembly in a retracted position.
Figure 2:
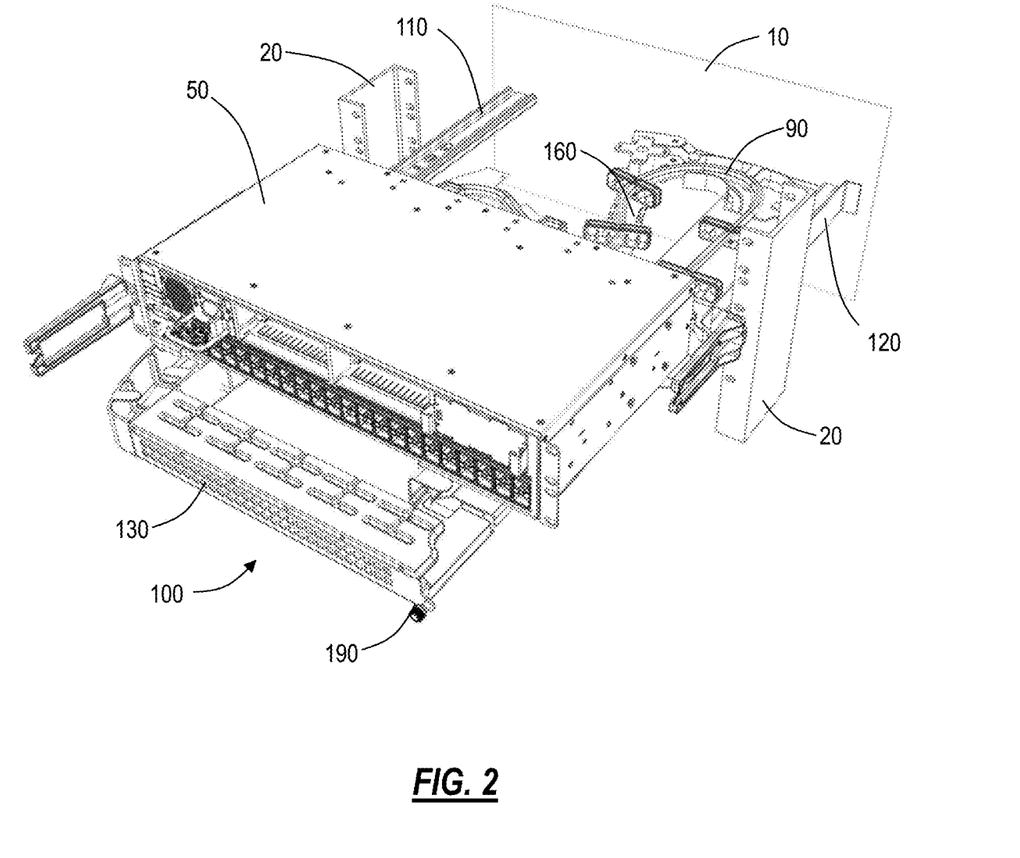
FIG. 2 is a perspective diagram of the sliding tray assembly and chassis of FIG. 1 with the tray in an extended position.

FIG. 1 is a perspective diagram of a sliding tray assembly 100 with a chassis 50 installed with a tray 130 of the sliding tray assembly 100 in a retracted position. FIG. 2 is a perspective diagram of the sliding tray assembly 100 and chassis 50 of FIG. 1 with the tray 130 in an extended position.

As can be seen in FIGS. 1 and 2, the sliding tray assembly 100 can include a sliding bracket assembly 110 and 120, a tray 130, and an arm 160. The sliding tray assembly 100 can be mounted to a rack via mounting brackets 20 at the sides of the assembly and a backplate 10 at a back of the assembly. The mounting brackets 20 and the backplate 10 can be part of the rack, part of an enclosed cabinet, a combination thereof, or can be mounted to walls or other structures of the rack and enclosed cabinet. For example, the backplate 10 can be a fixed back wall of an enclosed cabinet or can be a plate or bracket secured to the back wall of the enclosed cabinet or secured to the rack.

Figure 3:
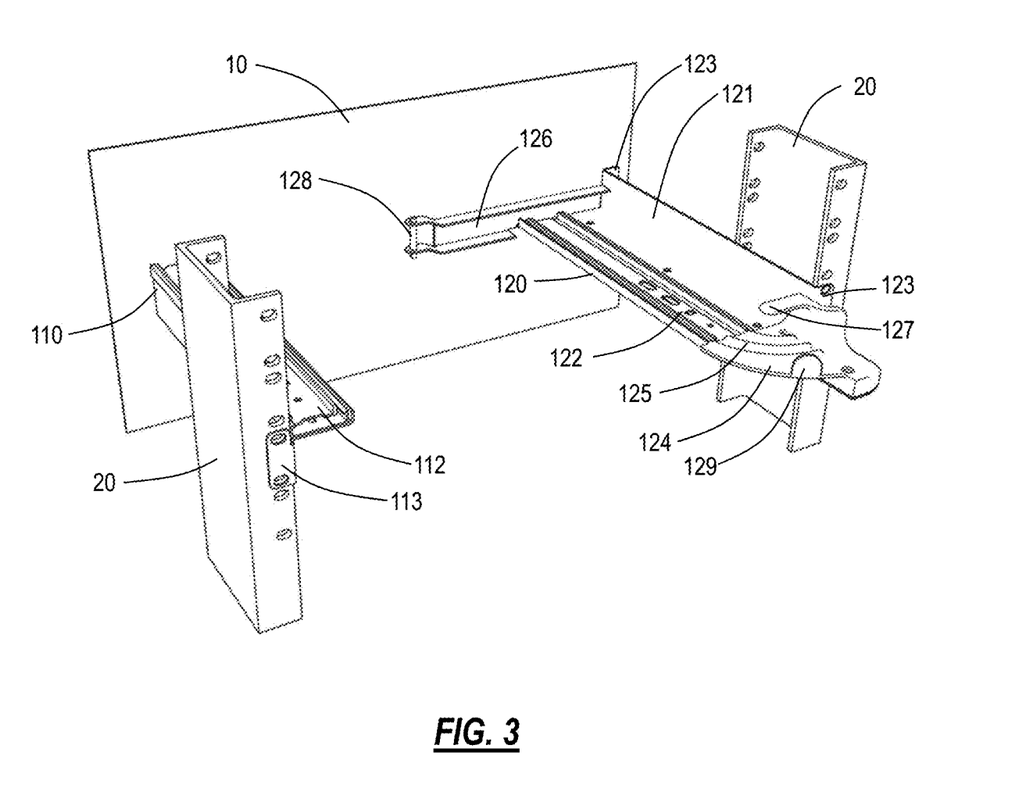
FIG. 3 is a perspective diagram of the sliding bracket assembly of FIGS. 1 and 2.

FIG. 3 is a perspective diagram of the sliding bracket assembly of FIGS. 1 and 2. As can be seen in FIG. 3, the sliding bracket assembly can include a first bracket 110 and a second bracket 120. The first bracket 110 can be affixed to one of the mounting brackets 20 and to the backplate 10, while the second bracket 120 can be affixed to the other of the mounting brackets 20 and to the backplate 10.

The first bracket 110 can include a bracket body 111 and a sliding bracket 112. An end of the first bracket 110 can be secured to the backplate 10 while an opposite end can be secured to the mounting bracket 20. Other configurations for mounting the first bracket 110 are also considered. Each end can include flanges 113 for securing the first bracket 110 to the backplate 10 and mounting bracket 20.

The sliding bracket 112 can include one or more portions of the bracket that move relative to the other portions of the bracket, such as by sliding. The sliding bracket 112 can be a ball bearing drawer slider and can have 2, 3, or more stages.

The second bracket 120 can include a bracket body 121, a sliding bracket 122, an entry trough 124 and an arm support bracket 126. An end of the bracket body 121 can be secured to the backplate 10 while an opposite end can be secured to the mounting bracket 20. Other configurations for mounting the first bracket 120 are also considered. Each end can include flanges 123 for securing the bracket body 121 to the backplate 10 and mounting bracket 20 or to other portions of the rack/cabinet.

The sliding bracket 122 can be secured to the bracket body can include one or more portions of the bracket that move relative to the other portions of the bracket, such as by sliding. The sliding bracket 122 can be a ball bearing drawer slider and can have 2, 3, or more stages.

The entry trough 124 can be attached to the end of the bracket body 121, secured to the mounting bracket 20, and positioned such that at least an end of the sliding bracket 122 can slide beyond, such as below, the entry trough 124. While the entry trough 124 is shown being secured to the bracket body 121, the entry trough 124 can be secured directly to the mounting bracket 20. The entry trough 124 can include protrusions 125, hook 127, and guide 129 that are configured to guide or restrain the fiber/cable entering the tray 130. Protrusions 125 can extend upward from a top surface of the entry trough 124, the hook 127 can extend parallel to the top surface of the entry trough 124 such that the fiber/cable entering the tray 130 can be positioned therebetween, and the guide 129 can extend upward from an edge of the entry trough 124.

The arm support bracket 126 can extend along the backplate 10 and transverse to the bracket body 121. The arm support bracket 126 can be integral to, secured to, or separate from the bracket body 121 and is configured to be mounted at a back of the rack. The arm support bracket 126 can also be secured to the backplate 10 or directly to the rack. The arm support bracket 126 can include a pin 128 that can be positioned distal to the bracket body 121 and the sliding bracket 122.

Figure 4:
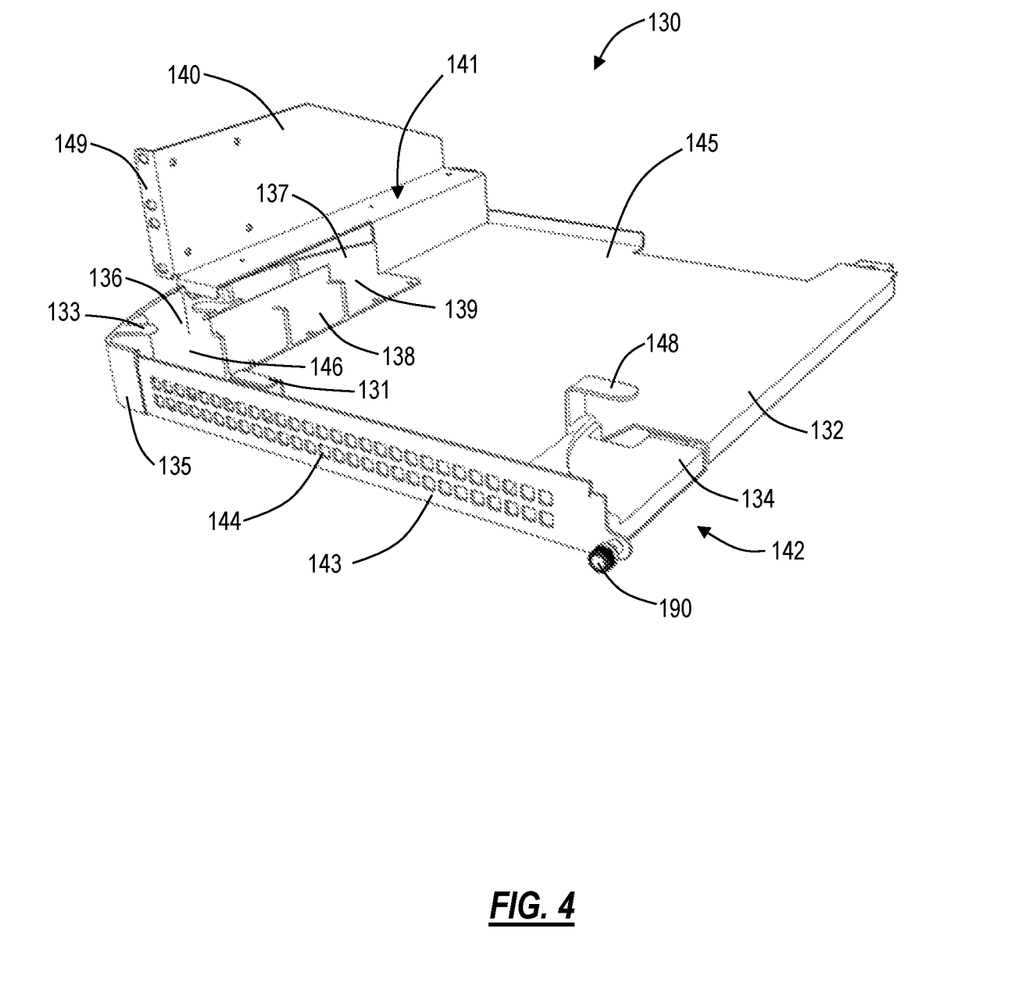
FIG. 4 is a perspective diagram of the tray of FIGS. 1 and 2.

FIG. 4 is a perspective diagram of the tray 130 of FIGS. 1 and 2. The tray 130 can include a base 132, a front plate 143, a trough slot 134, a first chassis support bracket 140, and a first guide channel 136. The base 132 can generally have a rectangular shape and can be sized to fit within a rack/cabinet. The front plate 143 can be positioned at a front end 142 of the base 132, opposite a back end 145 of the base 132. The front plate 143 can extend upward from and across the front end 142. The front plate 143 can include openings 144, which can allow for airflow therethrough.

The trough slot 134 can be a slot shaped to receive the entry trough 124 (refer to FIG. 6) and can be positioned at a corner of the base 132 adjacent the front plate 143 at the front end 142. A hook 148 can be adjacent the trough slot 134, which can be configured to guide the fiber/cable.

The first chassis support bracket 140 can be positioned on a side of the base opposite the trough slot 134 and can be configured to secure the chassis 50 to the tray 130. The first chassis support bracket 140 can include a first support surface 141 that can be positioned on a plane different than the base, such as above the base 132, to support the chassis 50 in a position offset from the base 132.

The first guide channel 136 can be configured to guide the fiber/cable to the corner of the front end 142 opposite the trough slot 134. At least a portion of the first guide channel 136 can be positioned one a different plane than the first support surface 141, such as under the first support surface 141 and can guide the fiber/cable between the first support surface 141 and the base 132.

The first guide channel 136 can be formed via a first guide bracket 135 attached to the base 132. The first guide bracket 135 can include channel walls 137 and 138. The channel walls 137 and 138 can extend upward from the base 132 and can remain at a level different, such as below, the first support surface 141 to not interfere with the chassis 50 when the chassis 50 is secured to the tray 130. The channel walls 137 and 138 can be configured to form a channel exit 146 at the front end 142 adjacent the front plate 143 and to form a channel entry 139 at an opposite end of the first guide bracket 135, between the front end 142 and the back end 145. The first guide bracket 135 can also include guides 133 extending over the channel from the channel walls 137 and 138 for guiding the fiber/cable in the first guide channel 136.

The tray 130 can also include a hook 131 that is positioned adjacent the channel exit 146 and is configured to guide the fiber/cable along the front end 142.

Figure 5:
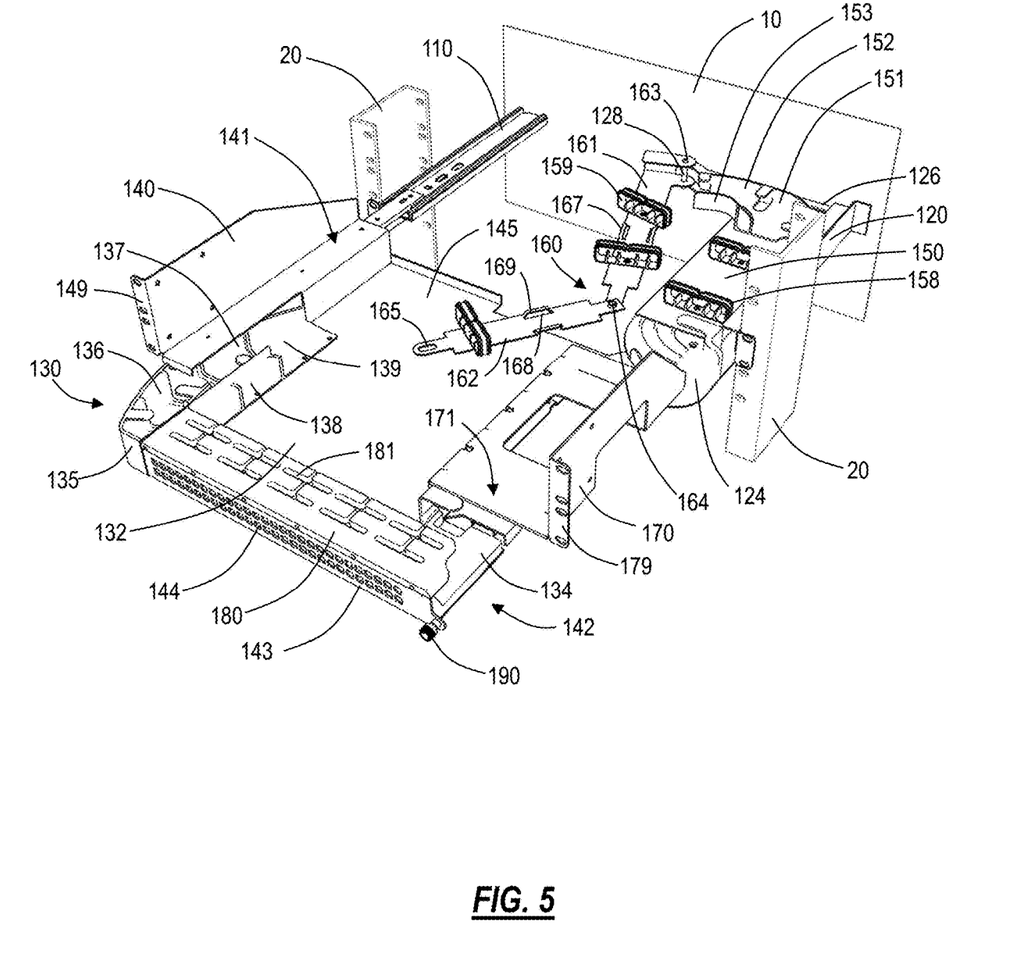
FIG. 5 is a perspective diagram of the sliding tray assembly of FIGS. 1 and 2 with the tray in an extended position.
Figure 6:
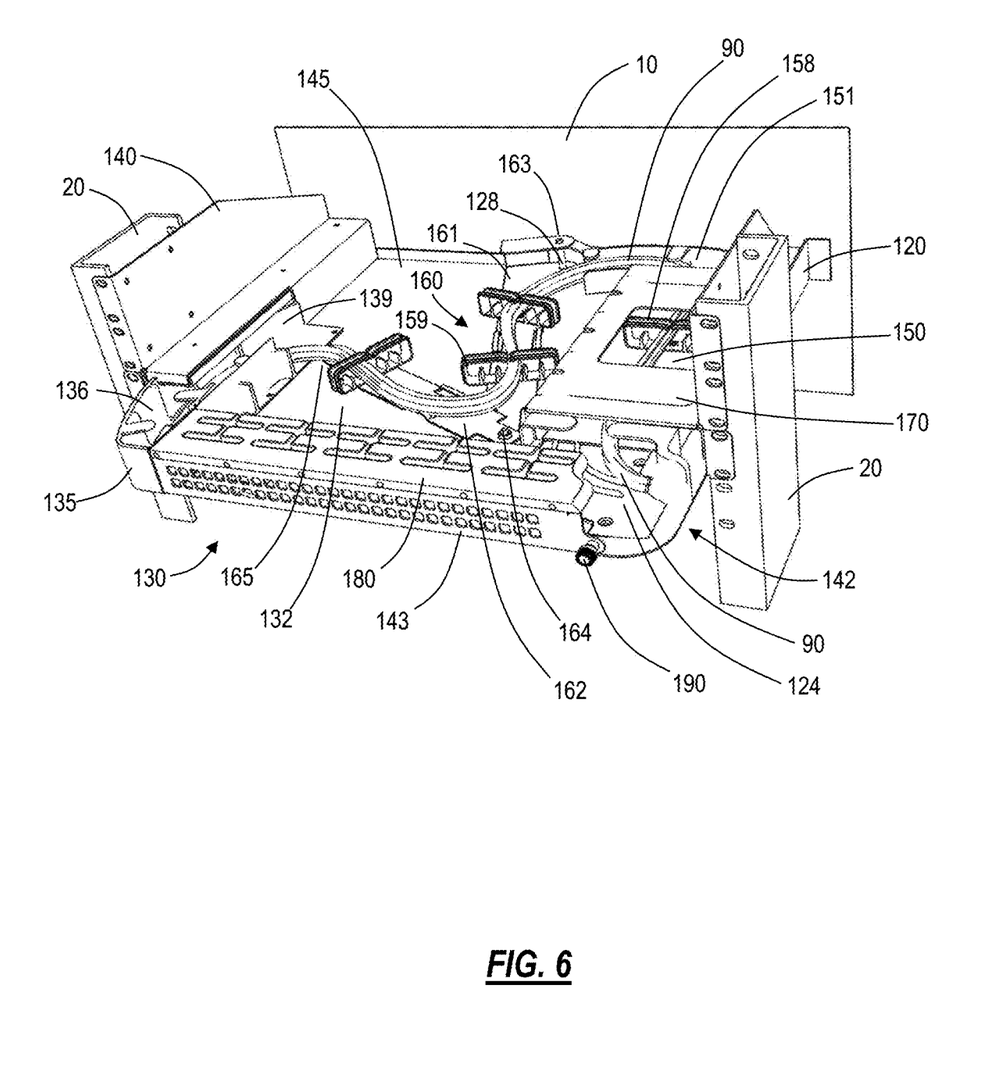
FIG. 6 is a perspective diagram of the sliding tray assembly of FIGS. 1, 2, and 5 with the tray in a retracted position.

FIG. 5 is a perspective diagram of the sliding tray assembly 100 of FIGS. 1 and 2 with the tray 130 in an extended position. FIG. 6 is a perspective diagram of the sliding tray assembly 100 of FIGS. 1, 2, and 5 with the tray 130 in a retracted position.

The tray 130 can be slidably mounted to the sliding brackets 112 and 122. The tray 130 can also include a second chassis support bracket 170, a front-end cover 180, and a locking pin 190. The second chassis support bracket 170 can be positioned opposite the first chassis support bracket 140 and can be adjacent the trough slot 134. The second chassis support bracket 170 can include a second support surface 171 that is positioned on a plane different than the base 132, such as above the base 132, to support the chassis 50 in a position offset from the base 132. The second support surface 171 can align with the first support surface 141.

The first and second chassis support brackets 140 and 170 can include flanges 149 and 179 respectively. The flanges 149 and 179 can be configured to secure the first and second support brackets 140 and 170 to the mounting brackets 20 via fasteners when the tray 130 is in a retracted position of FIG. 6. The fasteners can be removed/released to allow the tray 130 to move to the extended position of FIG. 5.

The front-end cover 180 can be positioned over the front end 142 of base 132 and can extend from a top of the front plate 143, offset from the base 132. The base 132, front plate 143, and front-end cover 180 can form a channel along the front end 142 for the fiber/cable. The front-end cover 180 can include slots 181 which can be configured to allow the fiber/cable to pass therethrough. The slots 181 can be configured such that ends of some of the slots extend to an end of the front-end cover 180 opposite the front plate 143 such that the fiber/cable can be fed into the slots from the end of the front-end cover 180.

The locking pin 190 can be a fastener that secures the tray 130 to the second bracket 120, such as to the entry trough 124, to secure the tray 130 in the retracted position.

As can be seen in FIGS. 1 and 6, the front of the tray 130 including the front end 142 of the base 142, the front plate 143, the front end cover 180, and the entry trough 124 can protrude beyond the mounting brackets 20, the first and second chassis support brackets 140 and 170, and the chassis 50 when the chassis 50 is mounted to the first and second chassis support brackets 140 and 170.

Referring to FIGS. 5 and 6, the sliding tray assembly 100 can also include an arm 160 and a second guide bracket 150. The arm 160 is configured to control and organize slack in the fiber/cable 90 so that the tray 130 is free to move between the extended and retracted positions. The arm 160 can guide the fiber/cable from a back of the rack to the tray 130. The arm 160 can include multiple links, such as a first link 161 and a second link 162. The multiple links can be pivotally joined to each other, the tray 130, and to the cabinet/backplate 10 via pivot joints. With this configuration, the links can pivot and move into a folded position when the tray 130 is in the retracted position where the sliding brackets 112 and 122 are retracted and the back end 145 of the tray 130 is adjacent a back of the rack and the arm support bracket 126. The arm 160 can fold and be positioned above the base 132 within the tray 130 when the tray is in the retracted position. The links can pivot and move into an extended position when the tray 130 is moved to the extended position, such that the arm 160 is straighter, with less of the arm 160 positioned within the tray 130. In the extended position, the sliding brackets 112 and 122 can be extended and the back end 145 of the tray 130 can be further from the back of the rack and further from the arm support bracket 126 than when in the retracted position. The angles between adjacent links can be larger in the extended position than the angles between adjacent links in the folded position. The arm 160 can be on a plane that is different than that of the first and second support surfaces 141 and 171 such that the multiple links can be folded below the chassis 50 when the tray 130 is in the retracted position The arm 160 can include a first link 161 and a second link 162. The first link 161 can be pivotally connected to the arm support bracket 126 via a first joint 163, which can be formed using the pin 128. The second link 162 can be pivotally connected to the base 132 via a second joint 165. The first link 161 and the second link 162 can be pivotally joined to each other via a third joint 164, the third joint being at the ends of the first and second links 161 and 162 distal to the first and second joints 163 and 165 respectively. Further links can be pivotally connected between the first and second links 161 and 162.

Each of the multiple links can include clips 159 that are configured to hold the fiber/cable 90 in place along a length of the links. Each of the multiple links can also include strap mounts 167 for securing straps, such as hook and loop fasteners, to the links for further securing the fiber/cable 90 to the links. The strap mounts 167 can include a slot 168, a bar 169, or a combination thereof for attaching straps to the links.

The second guide bracket 150 can be positioned adjacent the entry trough 124 and can extend over at least a portion of the second bracket 120 between the entry trough 124 and the backplate 10. The second guide bracket 150 can include clips 158 and a second guide channel 151. The clips 158 can be configured to hold the fiber/cable 90 in place along the second guide bracket 150 between the entry trough 124 and the second guide channel 151. The second guide channel 151 can be formed by guide walls 152 and 153 and can extend along the backplate 10 and arm support bracket 126. The second guide channel 151 can guide the fiber/cable 90 to the first link 161 and can terminate adjacent to the first joint 163. The entry trough 124 and the second guide bracket 150 can be a guide that directs fiber from a front of the rack to a back of the rack. The guide can be on a plane different than the first and second support surfaces 141 and can extend along the second bracket 120/sliding bracket 122.

When the tray 130 is in the retracted position, as shown in FIG. 6, the second chassis support bracket 170 can cover at least a portion of the second guide bracket 150 such that the second chassis support bracket 170 and the second guide bracket 150 form an entry channel for the fiber/cable 90.

As shown in FIG. 6, the fiber/cable 90 can enter the sliding tray assembly 100 at the entry trough 124 and extend into the sliding tray assembly 100 through the entry channel along the second guide bracket 150 and through the second guide channel 151 to the arm 160. The fiber/cable 90 extends along the arm 160 and into the first guide channel 136 at the channel entry 139. The fiber/cable 90 extends through the first guide channel 136 and out of the channel exit 146 to the front end 142 of the tray 130. Each individual fiber/cable 90 can then be brought up through a slot 181 in the front-end cover 180 depending on where the fiber/cable 90 connects to the chassis 50 (refer to FIGS. 1 and 2) mounted on the first and second chassis support brackets 140 and 170.

When the tray 130 is moved to the extended position, the base 132 slides out under the entry trough 124 and the second guide bracket 150, such that the fiber/cable 90 entering the sliding tray assembly 100 therethrough can be undisturbed. The first and second chassis support brackets 140 and 170 can be secured to the base 132 and can be configured to move with the base 132, such that the chassis 50 moves with the tray 130. Since the chassis 50 can move with the tray 130, the chassis 50 can slide out of the cabinet with the tray 130 while remaining in-service, enabling rear access to the chassis from the front while the chassis 50 is in service.

It will be appreciated that some embodiments described herein may include or utilize one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field-Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application-Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured to," "logic configured to," etc. perform a set of operations, steps, methods, processes, algorithms, functions, techniques, etc. on digital and/or analog signals as described herein for the various embodiments.

Moreover, some embodiments may include a non-transitory computer-readable medium having instructions stored thereon for programming a computer, server, appliance, device, processor, circuit, etc. to perform functions as described and claimed herein. Examples of such non-transitory computer-readable medium include, but are not limited to, a hard disk, an optical storage device, a magnetic storage device, a Read-Only Memory (ROM), a Programmable ROM (PROM), an Erasable PROM (EPROM), an Electrically EPROM (EEPROM), Flash memory, and the like. When stored in the non-transitory computer-readable medium, software can include instructions executable by a processor or device (e.g., any type of programmable circuitry or logic) that, in response to such execution, cause a processor or the device to perform a set of operations, steps, methods, processes, algorithms, functions, techniques, etc. as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A sliding tray assembly for rack mounted equipment comprising:
   a sliding bracket assembly configured to mount to a rack;
   an arm support bracket configured to mount at a back of the rack;
   a tray configured to slidably mount to the sliding bracket assembly, the tray including a base and one or more surfaces, offset from the base, configured to support a chassis; and
   an arm configured to direct fiber from the back of the rack to the tray, the arm including multiple links pivotally joined together, the multiple links including a first link configured to be pivotally joined to the arm support bracket and a second link configured to be pivotally joined to the base of the tray at a position offset from a back end of the tray, the arm being on a plane different than the one or more surfaces configured to support the chassis such that the multiple links are folded between the chassis and the base when the tray is in a retracted position.

2. The sliding tray assembly of claim 1, wherein in the retracted position the back end of the tray is adjacent the back of the rack and the multiple links of the arm are in a folded position, and in an extended position the back end of the tray is further from the back of the rack than in the retracted position and the angles between adjacent links are larger in the extended position than in the retracted position.

3. The sliding tray assembly of claim 1, further comprising a guide that is on a plane different than the one or more surfaces configured to support the chassis, the guide being configured to direct fiber from a front of the rack to the back of the rack.

4. The sliding tray assembly of claim 3, wherein the guide includes an entry trough positioned at the front of the rack and a guide bracket extending along the bracket from the entry trough to the arm support bracket.

5. The sliding tray assembly of claim 1, wherein the arm includes at least one of (1) one or more clips on at least one of the multiple links, the one or more clips configured to hold the fiber, and (2) one or more strap mounts on at least one of the multiple links, the one or more strap mounts configured to receive straps for securing the fiber to the arm.

6. The sliding tray assembly of claim 1, wherein the tray includes a guide channel configured to direct the fiber to a front end of the tray from a position located between the front end and the back end.

7. The sliding tray assembly of claim 1, wherein a front end of the tray is configured to protrude beyond the chassis, the tray including a front-end cover configured to cover the front end, the front-end cover including slots configured for fiber to extend therethrough.

8. A method for managing fiber of rack mounted equipment comprising:
  providing a sliding bracket assembly;
  providing an arm support bracket configured to mount at a back of the rack;
  providing a tray configured to slidably mount to the sliding bracket assembly, the tray including a base and one or more surfaces, offset from the base configured to support a chassis; and
  providing an arm configured to direct fiber from the back of the rack to the tray, the arm including multiple links pivotally joined together, the multiple links including a first link configured to be pivotally joined to the arm support bracket and a second link configured to be pivotally joined to the base of the tray at a position offset from a back end of the tray, the arm being on a plane different than the one or more surfaces configured to support the chassis such that the multiple links are folded between the chassis and the base when the tray is in a retracted position.

9. The method of claim 8, further comprising retracting the tray into the retracted position such that the back end of the tray is adjacent the back of the rack and the multiple links of the arm are in a folded position between the chassis and the base, and extending the tray into an extended position such that the back end of the tray is further from the back of the rack than in the retracted position and the angles between adjacent links are larger in the extended position than in the retracted position.

10. The method of claim 8, further comprising providing a guide that is on a plane different than the one or more surfaces configured to support the chassis, the guide being configured to direct fiber from a front of the rack to the back of the rack.

11. The method of claim 10, wherein the guide includes an entry trough positioned at the front of the rack and a guide bracket extending along the bracket from the entry trough to the arm support bracket.

12. The method of claim 8, further comprising providing at least one of (1) one or more clips on at least one of the multiple links, the one or more clips configured to hold the fiber, and (2) one or more strap mounts on at least one of the multiple links, the one or more strap mounts configured to receive straps for securing the fiber to the arm.

13. The method of claim 8, wherein the tray includes a guide channel configured to direct the fiber to a front end of the tray from a position located between the front end and the back end.

14. The method of claim 8, wherein a front end of the tray is configured to protrude beyond the chassis, the tray including a front-end cover configured to cover the front end, the front-end cover including slots configured for fiber to extend therethrough.

15. A system comprising:
  a rack including mounting brackets; and
  a sliding bracket assembly including
    a sliding bracket assembly mounted to the mounting brackets,
    an arm support bracket mounted at a back of the rack,
    a tray slidably mounted to the sliding bracket assembly, the tray including a base and one or more surfaces, offset from the base, configured to support a chassis, and
    an arm configured to direct fiber from the back of the rack to the tray, the arm including multiple links pivotally joined, the multiple links including a first link pivotally joined to the arm support bracket and a second link pivotally joined to the base of the tray at a position offset from a back end of the tray, the arm being on a plane different than the one or more surfaces configured to support the chassis such that the multiple links are folded between the chassis and the base when the tray is in a retracted position.

16. The rack of claim 15, wherein in a retracted position the back end of the tray is adjacent the back of the rack and the multiple links of the arm are in a folded position, and in an extended position the back end of the tray is further from the back of the rack than in the retracted position and the angles between adjacent links are larger in the extended position than in the retracted position.

17. The rack of claim 15, wherein the arm further includes at least one of (1) one or more clips on at least one of the multiple links and (2) one or more strap mounts on at least one of the multiple links.

\* \* \* \* \*